United States Patent [19]

Katz

[11] Patent Number: 5,336,896
[45] Date of Patent: Aug. 9, 1994

[54] CELLULAR TELEPHONE USERS PROTECTIVE DEVICE

[76] Inventor: Joseph M. Katz, 11 Meadow Rd., Old Westbury, N.Y. 11568

[21] Appl. No.: 13,399

[22] Filed: Feb. 4, 1993

[51] Int. Cl.$^5$ .............................................. H05K 9/00
[52] U.S. Cl. .................... 250/515.1; 174/35 R; 174/35 GC; 361/816; 343/851
[58] Field of Search ............... 250/515.1, 517.1, 505.1; 174/35 R, 35 GC; 307/91; 361/424, 399; 343/851

[56] References Cited

U.S. PATENT DOCUMENTS

| 4,725,846 | 2/1988 | Hendershot | 343/715 |
| 4,800,392 | 1/1989 | Garay et al. | 343/702 |
| 4,868,576 | 9/1989 | Johnson, Jr. | 343/895 |
| 5,181,043 | 1/1993 | Cooper | 343/715 |
| 5,235,492 | 8/1993 | Humbert et al. | 174/35 GC |

*Primary Examiner*—Paul M. Dzierzynski
*Assistant Examiner*—Kiet T. Nguyen

[57] ABSTRACT

An accessory for cellular telephones that will afford some protection to cellular telephone users from the alleged brain, head and body damage caused by the electro-magnetic radiation of cellular telephone use and to also provide a comfortable handle for using and carrying the cellular telephone.

1 Claim, 5 Drawing Sheets

CELLULAR TELEPHONE USERS PROTECTIVE DEVICE

BACKGROUND OF THE INVENTION

1. Field of the Invention

The invention relates to providing some protection to the users of cellular telephones from the electro-magnetic radiation emitting therefrom and to provide an antenna with a tilt and swivel base to permit moving the antenna away from close contact with the users head when in use and to also supply a comfortable handle when carrying and in use.

2. Description of the Prior Art

There is no prior art.

SUMMARY OF THE INVENTION

There is much concern throughout the world that electro-magnetic fields radiation from cellular telephones and its antenna can cause damage to the brain, tumers and cancer due to the close contact of the telephone and antenna to the head, when in use.

There are thousands upon thousands of these telephones in use. They are used in automobiles, by pedestrians, trucks, in offices and elsewhere. People walk in the street talking into them using small hand held portable cellular telephones. Due to its portability and long range it has become very popular and useful. It is a big and growing industry. Since the cellular telephone is small and lightweight and does not require a fixed wire it is portable and popular. However, since it is a telephone with an earphone and mouthpiece to talk into and an antenna to broadcast and receive the messages and uses portable electricity to operate it, it emits electro-magnetic radiation which could be dangerous since it is used by placing the telephone in close contact against the side of the head from the ear to the mouth and the antenna touches or is close to the users head. That is an exposure. The antenna and the cellular telephone give off electro-magnetic radiation and being so close to the head and brain the danger is apparent.

There has been a recent scientific discovery that the brain contains a magnet. Therefore, it is believed that as one possibility the magnet in the brain attracts the emitted rays and has a detrimental effect on the brain cells, thereby, over a period of time, detrimental buildup might occur.

Because of the hazards involved and the clumsiness to use and carry the cellular telephone, this device was invented. Its purpose is to provide a one piece lightweight protective electro-magnetic radiation shielded jacket to contain the cellular telephone within it with an attached outside antenna with a tilt & swivel base to permit the user to tilt and swivel the antenna away from the users head. The cellular telephones in current use have a fixed antenna that only allows a non-bending antenna, which antenna follows the direction of the cellular telephone thereby resting or is in very close contact with the users head. The current cellular telephones in use are either with a rigid one piece fixed antenna or of a rigid slide out telescoping type. There are no provisions for adjusting the antenmna away from the head.

The device is simple to use, the cellular telephone is permanently installed or removable, as desired. The operator simply puts the cellular telephone into the electro-magnetic radiation shielded jacket and slides the antenna tip into the swivel antenna's cupping end that is inside the jacket. When they desire to use the telephone they simply pull up the swivel antenna, open a door in the front that exposes the dial, dial the number wanted and shut the door. They than adjust the swivel antenna to a position that faces the outer tip in a direction farthest from their head. They then talk and listen through the holes in the jacket. When either carrying or talking and listening, they can hold the handle affixed to the jacket which provides safety from slippage and comfortable use.

The elements show in the FIGS. 1–6:

1 is an oblong box-like jacket.
2 is a front door.
3 is a telescoping antenna.
4 is a tilt and swivel device.
5 is a cuplike antenna connector to fasten to the cellular telephone's antenna to effect antenna continuity.
6 is a hole for speaking into cellular telephone.
7 are holes for listening from the cellular telephone.
8 is a front door clip.
9 is an electro-magnetic radiation shielding.
10 is a handle.
11 is telephone dial numbers.
12 is a tip of a cellular telephone equipment antenna.
13 is a cellular telephone.
14 is a display window.
15 is control buttons.
16 is a bottom door.
17 is a bottom door clip.

DESCRIPTION OF THE PREFERRED EMBODIMENTS

Figure 1:
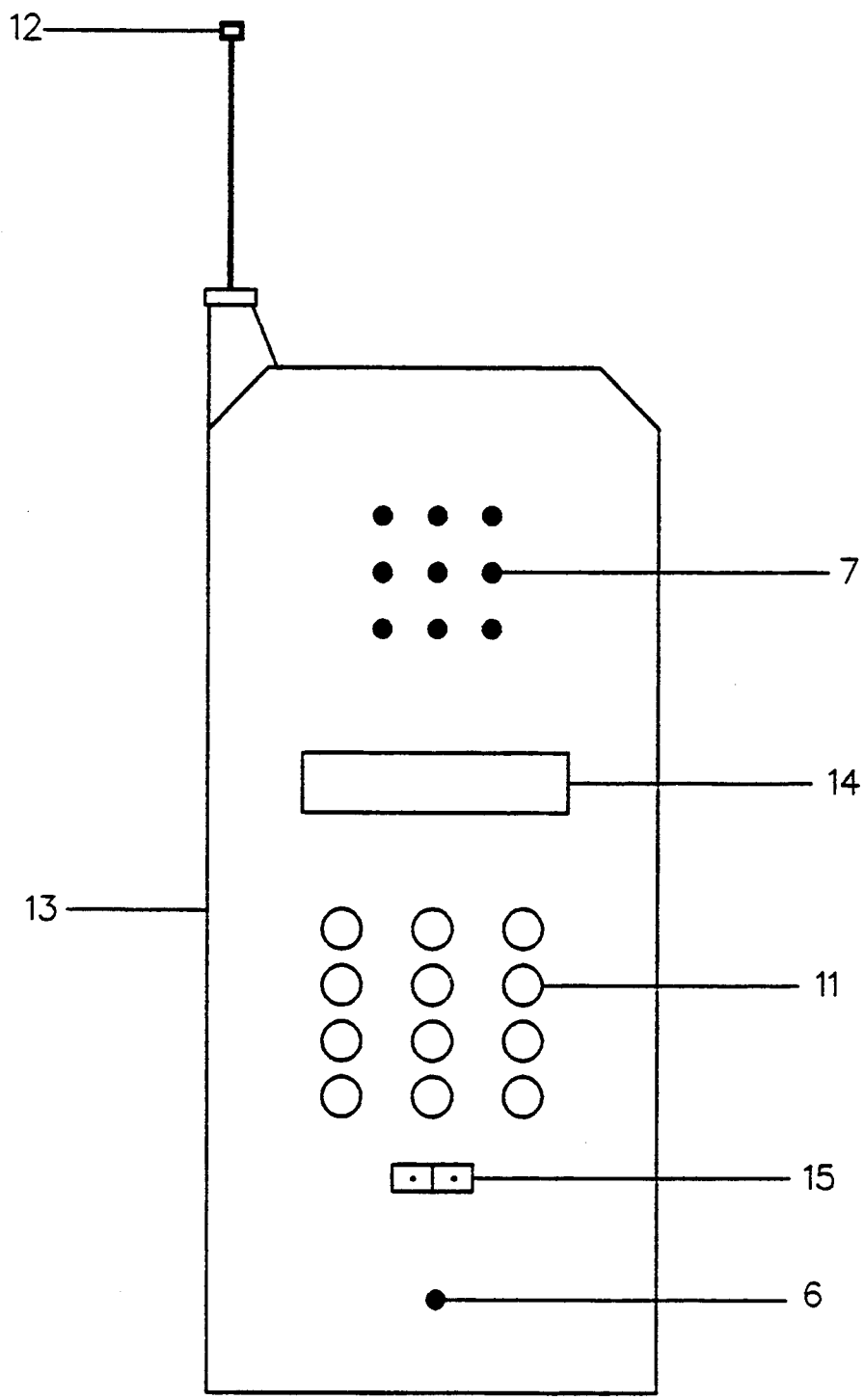
FIG. 1 is a cellular telephone.
Figure 2:
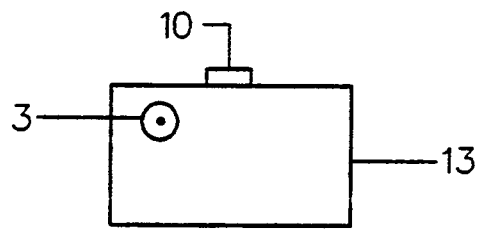
FIG. 2 is a top view of the invention.
Figure 4:
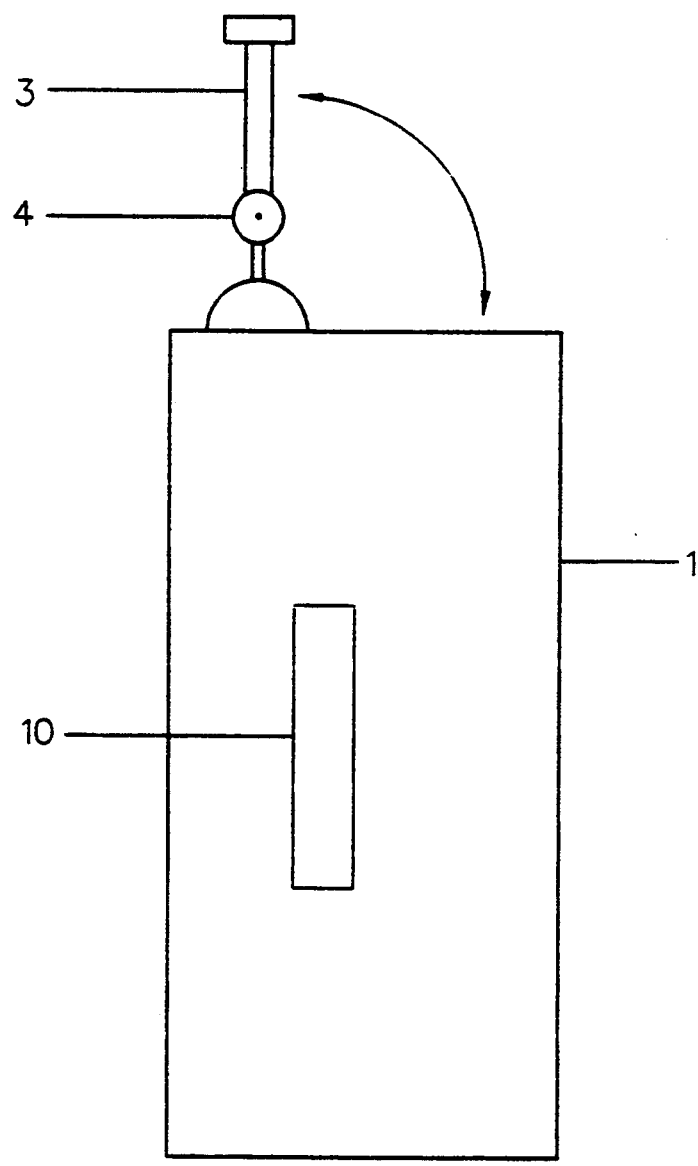
FIG. 4 is a rear view of the invention.
Figure 3:
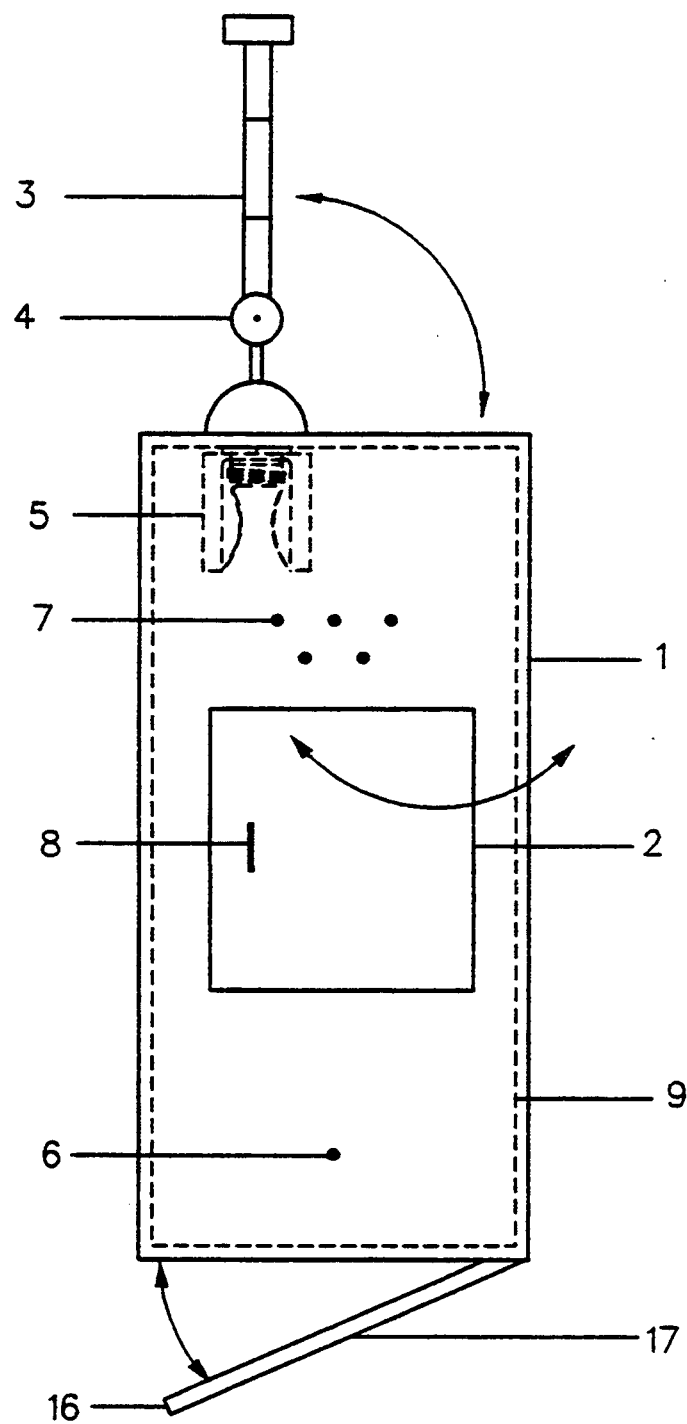
FIG. 3 is a front view of the invention.
Figure 5:
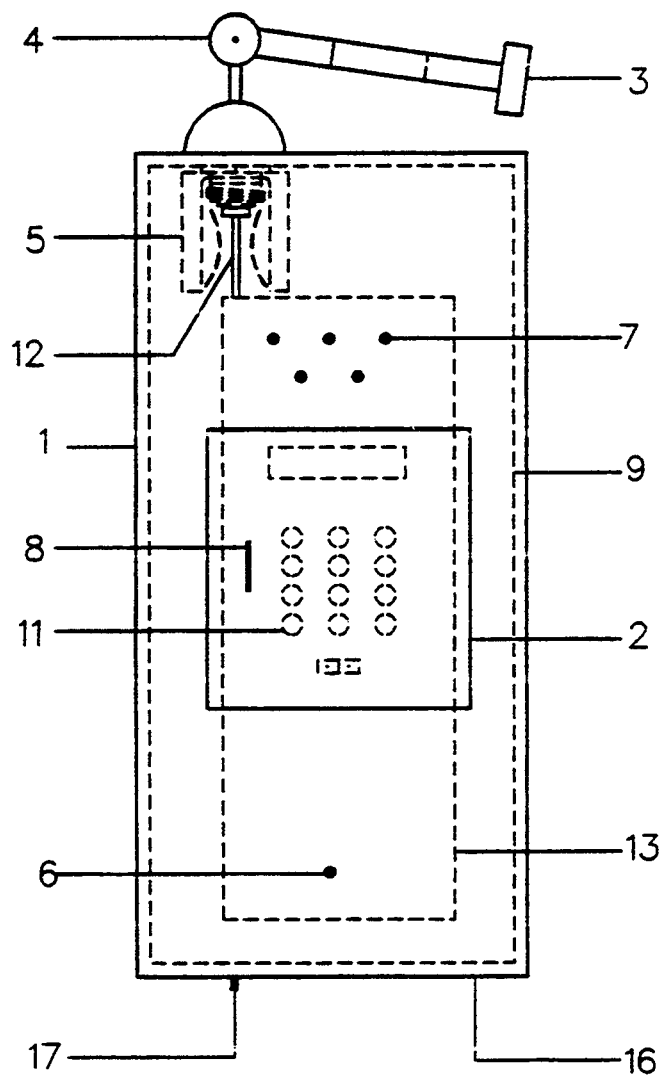
FIG. 5 is a front view of the invention with a cellular telephone.
Figure 6:
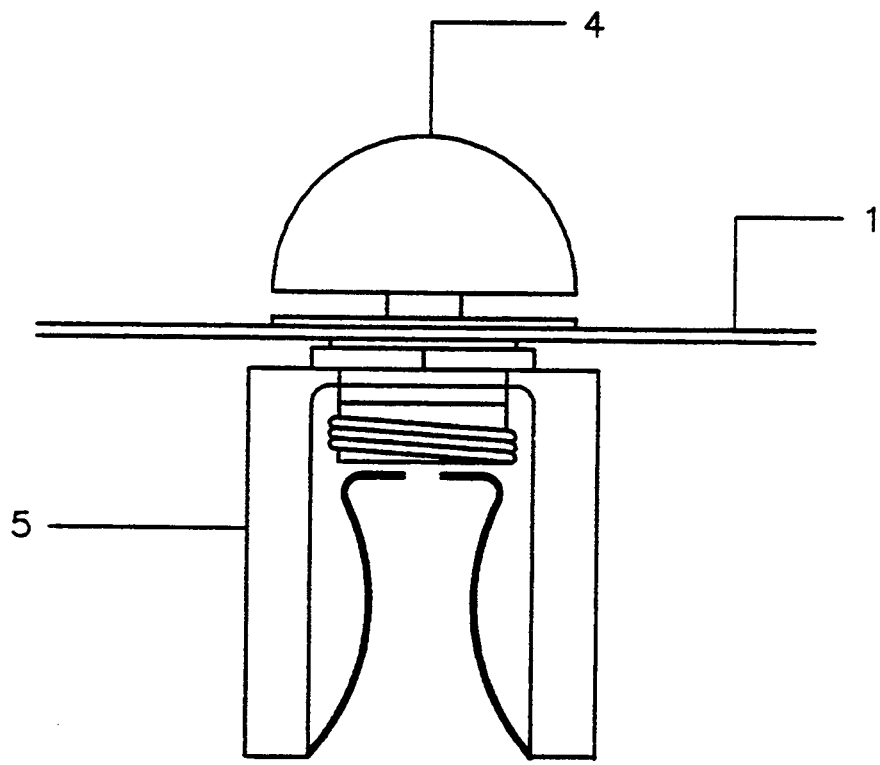
FIG. 6 is a cuplike antenna connector.

The invention consists of an oblong box-like jacket 1 closed at both ends as shown in FIG. 3. It has a handle 10 affixed to the rear side for holding the cellular telephone 13 when talking or carrying as shown in FIG. 4. It is made from either flexible or firm materials depending upon the users wants and is manufactured in both materials. In FIG. 3 the jacket 1 contains a bottom door 16 at the bottom side to place the cellular telephone 13 shown in FIG. 1 into it, a front door 2 in the front side to dial the numbers 11 wanted, a small hole 6 provides below the front door 2 and penetrate through the front side of the oblong box 1 and an electro-magnetic radiation shielding 9 for talking into the cellular telephone 13 and a small holes 7 provide above the front door 2 and penetrate through the front side of the oblong box 1 and the electro-magnetic radiation shielding 9 for listening from the cellular telephone 13. The electro-magnetic radiation shielding 9 is affixed on the inside to all sides, top, bottom and doors of the jacket completely covering the inside of the jacket 1. On the outside top of the jacket 1 a telescoping antenna 3 with a tilt and swivel 4 at its base is installed onto the jacket 1 and the tilt and swivel connector's base 4 penetrates through the top of the jacket 1 and the electro-magnetic radiation shielding 9 where it is attached to a cup like antenna connector 5 to the swivel connector's base 4 at the inside top of the jacket 1. The tip of the cellular telephone's antenna FIG. 1, 12 is then slid into and attaches to the interior cuplike antenna connector 5 when the cellular telephone FIG. 1 is placed inside of the jacket 1. This substitutes the tilt and swivel antenna 3 for the cellular telephone equipment antenna 12, and forms the antenna circuit for effecting antenna continuity.

The invention is an assembly for attenuating the passage of electro-magnetic radiation emitted from a cellular telephone 13 comprising an electro-magnetic radiation shielding 9 affixed to the entire inside of an oblong box 1 and a cuplike antenna connector 5 that is penetrating to the inside of the oblong box 1 to form an antenna circuit for effecting an antenna continuity from the attached outside collapsable, tilt and swivel antenna 4 that provides for adjusting the antenna away from closeness to the operator's head to minimize the effects of the electro-magnetic radiation from the antenna 3 and from the cellular telephone 13. The jacket has the front door 2 and the bottom door 16, one to insert the cellular telephone 13 and the other to use when dialing the calling numbers 11. It also has a handle 10 attached to the closed rear side of the oblong box 1 for ease in carrying and when using the telephone. The function of the invention is to afford some protection from the electro-magnetic radiation from the cellular telephone 13 FIG. 1 by use of electro-magnetic radiation shielding 9 completely over the telephone FIG. 5 and to provide a means to tilt the antenna 3 away from the users close head contact by being able to swivel 4 and tilt the collapsable antenna 3 away from users close head contact to reduce exposure from the electro-magnetic radiation from the existing extremely close distance to the users head of the cellular telephone equipment antenna 12 and also to provide a handle 10 for carrying and using the cellular telephone 13 shown in FIG. 1.

Protection and comfort are the functions of the invention. The electro-magnetic shielding material 9 is manufactured by many companies of diverse materials.

While various changes may be made in the detailed construction, such changes will be within the spirit and scope of the present invention, as defined by the appended claim.

I claim:

1. An assembly for attenuating the passage of electro-magnetic radiation emitted from a cellular telephone, said assembly comprising:
    a) an oblong box having four closed sides, a closed top side and a closed bottom side, a middle of a front closed side of said four closed sides provides a front door, said front door has means for opening and closing to provide access to dialing telephone numbers in an open position, said closed bottom side provides a bottom door, and said bottom door has means for opening and closing said bottom door to insert said cellular telephone into said oblong box;
    b) an electro-magnetic radiation shielding affixed to the entire inside of said four closed sides including said front door, said closed top side and said closed bottom side including said bottom door of said oblong box;
    c) a handle means mounted to an outside of a rear side of said four closed sides of said oblong box for carrying the cellular telephone;
    d) a telescoping antenna means connected to a tilt and swivel base connector means, said tilt and swivel base connector means is attached to said closed top side of the oblong box and penetrated through said closed top side and said electro-magnetic radiation shielding, said tilt and swivel base connector means connects to a cuplike antenna connector means to form an antenna circuit for effecting an antenna circuitry, wherein said cuplike antenna connector means attached to an inside of said electro-magnetic radiation shielding and said oblong box; and
    e) several small holes provided on above and below said front door of said front side of said oblong box, said small holes penetrate through said front side of said oblong box and electro-magnetic radiation shielding for talking into and listening from said cellular telephone.

* * * * *